(12) United States Patent
Hermenau et al.

(10) Patent No.: US 12,342,631 B2
(45) Date of Patent: Jun. 24, 2025

(54) PHOTOVOLTAIC ELEMENT WITH IMPROVED EFFICIENCY IN THE EVENT OF SHADE, AND METHOD FOR PRODUCING SUCH A PHOTOVOLTAIC ELEMENT

(71) Applicant: HELIATEK GMBH, Dresden (DE)

(72) Inventors: Martin Hermenau, Dresden (DE); Jan Birnstock, Dresden (DE); Mickael Lapeyrade, Dresden (DE)

(73) Assignee: HELIATEK GMBH, Dresden (DE)

( * ) Notice: Subject to any disclaimer, the term of this patent is extended or adjusted under 35 U.S.C. 154(b) by 148 days.

(21) Appl. No.: 17/773,050

(22) PCT Filed: Oct. 30, 2020

(86) PCT No.: PCT/DE2020/100925
§ 371 (c)(1),
(2) Date: Apr. 29, 2022

(87) PCT Pub. No.: WO2021/083462
PCT Pub. Date: May 6, 2021

(65) Prior Publication Data
US 2023/0005992 A1    Jan. 5, 2023

(30) Foreign Application Priority Data
Oct. 30, 2019    (DE) .................... 10 2019 129 355.3

(51) Int. Cl.
*H10F 19/33*    (2025.01)
*H10K 30/81*    (2023.01)
(Continued)

(52) U.S. Cl.
CPC ............. *H10F 19/33* (2025.01); *H10K 30/81* (2023.02); *H10K 39/10* (2023.02); *H10K 39/12* (2023.02);
(Continued)

(58) Field of Classification Search
CPC .... H01L 31/0463; H10K 39/10; H10K 30/81; H10K 30/20; H10K 71/231; H10K 71/261; H10K 39/12; H10F 19/33
See application file for complete search history.

(56) References Cited

U.S. PATENT DOCUMENTS

2007/0090371 A1    4/2007    Drechsel
2009/0217980 A1    9/2009    Pfeiffer
(Continued)

FOREIGN PATENT DOCUMENTS

DE    102010018548 A1    11/2011
EP    1920468 A2    5/2008
(Continued)

OTHER PUBLICATIONS

English Machine Translation of DE2010018548A1 (Year: 2010).*

(Continued)

*Primary Examiner* — Kourtney R S Carlson
(74) *Attorney, Agent, or Firm* — LEYDIG, VOIT & MAYER, LTD.

(57) ABSTRACT

A photovoltaic element including at least one photovoltaic cell at least partially segmented and having a base electrode, a top electrode, and a layer system comprising at least one photoactive layer, wherein the layer system is arranged between the base electrode and the top electrode, the segments are configured such that at least the top electrode and the layer system of one of the segments are separated from the top electrode and the layer system of another segment by at least one cavity to prevent contact between one another, the at least one cavity is formed substantially vertically relative to the layer system of the at least one photovoltaic cell, and the segments are electrically conductively connected in parallel with one another such that a flow of (Continued)

electric current through the at least one photovoltaic cell is distributed over each of the segments.

19 Claims, 3 Drawing Sheets

(51) Int. Cl.
 *H10K 39/10* (2023.01)
 *H10K 39/12* (2023.01)
 *H10K 71/00* (2023.01)
 *H10K 71/20* (2023.01)
 *H10K 30/20* (2023.01)
(52) U.S. Cl.
 CPC ......... *H10K 71/231* (2023.02); *H10K 71/621* (2023.02); *H10K 30/20* (2023.02)

(56) References Cited

U.S. PATENT DOCUMENTS

| | | |
|---|---|---|
| 2010/0132759 A1 | 6/2010 | Jia |
| 2012/0118853 A1 | 5/2012 | Ogasawara |
| 2012/0126213 A1 | 5/2012 | Gresser |
| 2013/0014800 A1 | 1/2013 | Stephens et al. |
| 2013/0104968 A1 | 5/2013 | Pfeiffer |
| 2013/0160829 A1 | 6/2013 | Uhrich |
| 2014/0000684 A1 | 1/2014 | Blochwitz-Nimoth |
| 2015/0349164 A1 | 12/2015 | Rim |
| 2016/0020419 A1 | 1/2016 | Walzer |
| 2016/0141497 A1 | 5/2016 | Weiss |
| 2019/0006599 A1 | 1/2019 | Hildebrandt |
| 2019/0019957 A1 | 1/2019 | Hildebrandt |
| 2021/0288112 A1 | 9/2021 | Heimke |

FOREIGN PATENT DOCUMENTS

| | | |
|---|---|---|
| JP | 2014017447 A | 1/2014 |
| JP | 2014507814 A | 3/2014 |
| WO | WO 2004083958 A2 | 9/2004 |
| WO | WO 2006092134 A1 | 9/2006 |
| WO | WO 2008149835 A1 | 12/2008 |
| WO | WO 2009022414 A1 | 2/2009 |
| WO | WO 2010133208 A1 | 11/2010 |
| WO | WO 2011013219 A1 | 2/2011 |
| WO | WO 2011138021 A2 | 11/2011 |
| WO | WO 2011161108 A1 | 12/2011 |
| WO | WO 2014051889 A1 | 4/2014 |
| WO | WO 2014128278 A1 | 8/2014 |
| WO | WO 2014206860 A1 | 12/2014 |
| WO | WO 2017114937 A1 | 7/2017 |
| WO | WO 2017114938 A1 | 7/2017 |
| WO | WO 2018055214 A1 | 3/2018 |

OTHER PUBLICATIONS

English Machine Translation for WO2018055214A1 (Year: 2018).*
English Machine Translation for JP 2014017447A (Year: 2014).*
Atsushi Suzuki, Fabrication and characterization of $C_{60}$/tetrathiafulvalene solar cells Journal of Physics and Chemistry of Solids, Dec. 2010, pp. 1587-1591, vol. 71, Elsevier, Netherlands, doi:10.1016/j.jpcs.2010.08.007.

* cited by examiner

PHOTOVOLTAIC ELEMENT WITH IMPROVED EFFICIENCY IN THE EVENT OF SHADE, AND METHOD FOR PRODUCING SUCH A PHOTOVOLTAIC ELEMENT

CROSS-REFERENCE TO PRIOR APPLICATIONS

This application is a U.S. National Phase application under 35 U.S.C. § 371 of International Application No. PCT/DE2020/100925, filed on Oct. 30, 2020, and claims benefit to German Patent Application No. DE 10 2019 129 355.3, filed on Oct. 30, 2019. The International Application was published in German on May 6, 2021 as WO 2021/083462 A1 under PCT Article 21(2).

FIELD

The invention relates to a photovoltaic element comprising at least one photovoltaic cell, to a photovoltaic system comprising at least two such photovoltaic elements, and to a method for producing such a photovoltaic element.

BACKGROUND

Photovoltaic elements, particularly photovoltaic elements that are integrated into a building structure, are temporarily shaded. A photovoltaic element consists of at least one photovoltaic cell comprising at least one photoactive layer, which can be connected in series or in parallel. Photovoltaic elements or photovoltaic cells thereof connected in series are not always all shaded to the same extent, but are still partly exposed to sunlight. In this case, shaded photovoltaic cells connected in series with others generate an opposite voltage compared to non-shaded photovoltaic cells that restrict or block the flow of current from the other photovoltaic cells through that photovoltaic cell.

Methods known from the prior art for circumventing the problem of partial shading use bypass diodes in order to continue to ensure the flow of current of the photovoltaic cells connected in series and to avoid damage to the partly shaded photovoltaic cell. In the case of a shaded or defective photovoltaic cell, the power loss is reduced by connecting a bypass diode in parallel with the photovoltaic cell. If a photovoltaic element, in particular a photovoltaic cell of the photovoltaic element, is at least partly shaded, this photovoltaic cell generates no voltage or a lower voltage, and the current generated by the photovoltaic cells connected in series upstream of it cannot be conducted and damages the at least partly shaded photovoltaic cell. In such a case, the bypass diode can take over the conduction of the generated current from photovoltaic cells connected upstream to photovoltaic cells connected downstream through the bypass diode, thereby preventing damage to the shaded photovoltaic cell. A photovoltaic element can thus continue to function in an at least partly shaded photovoltaic cell. However, such a solution is very costly and requires a high level of complexity, which also leads to high additional costs.

US20150349164A1 discloses a solar cell comprising an integrated bypass diode, wherein the bypass diode and the solar cell include different areas next to each other on the substrate and are separated by a gap.

EP 1 920 468 B1 discloses organic photovoltaic cells comprising a bypass diode.

WO2014/051889A1 discloses a solar cell comprising a large number of photovoltaic cells, wherein the photovoltaic cells have a specific arrangement of intermediate spaces, such that the resulting areas of the cells allow only a maximum opposing voltage, and a number of bypass diodes can be reduced.

The disadvantage of the prior art, however, is that the integration of a complete bypass diode in photovoltaic cells during production has proven to be complex. The bypass diodes require a larger area that can no longer produce current, resulting in a greater power loss of the photovoltaic elements. Furthermore, the known methods are not suitable particularly for a roll-to-roll process for producing photovoltaic elements.

SUMMARY

In an embodiment, the present invention provides a photovoltaic element comprising at least one photovoltaic cell at least partially segmented into segments and having a base electrode, a top electrode, and a layer system comprising at least one photoactive layer, wherein the layer system is arranged between the base electrode and the top electrode, the segments are configured such that at least the top electrode and the layer system of one of the segments are separated from the top electrode and the layer system of another segment by at least one cavity so as to prevent contact between one another, the at least one cavity is formed at least substantially vertically relative to the layer system of the at least one photovoltaic cell, and the segments of the at least one photovoltaic cell are electrically conductively connected in parallel with one another such that a flow of electric current through the at least one photovoltaic cell is distributed over each of the segments.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
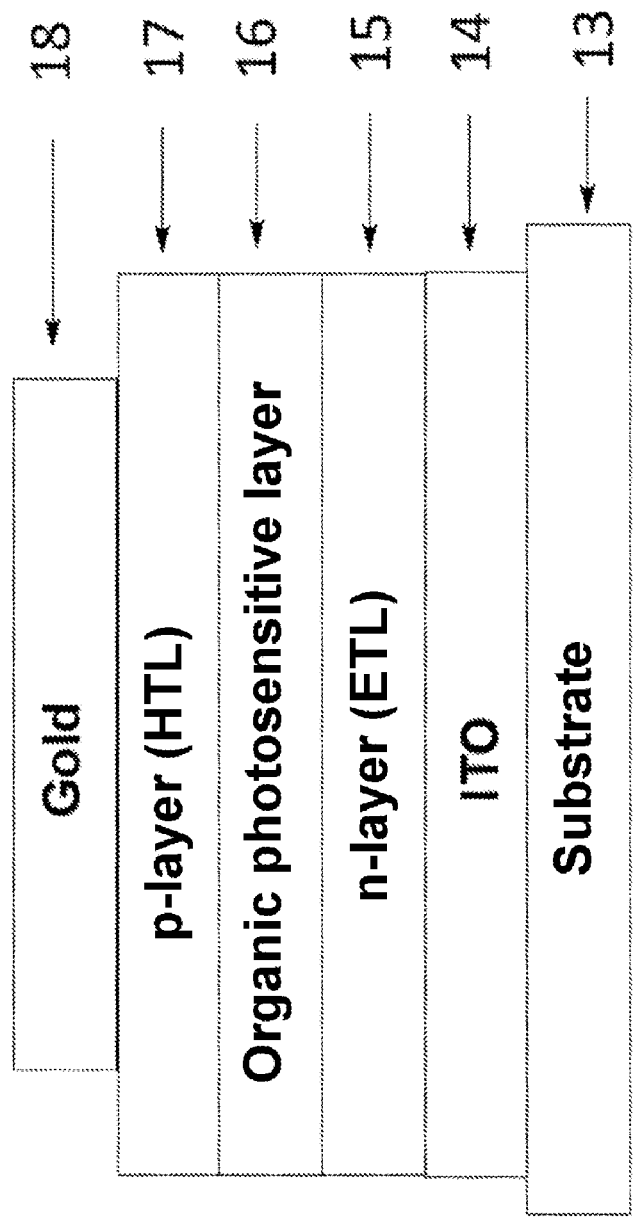
FIG. 1 shows a schematic representation of a structure of a layer system comprising electrodes of a photovoltaic cell.

In an embodiment, the invention provides a photovoltaic element with better efficiency in the case of at least partial shading of individual photovoltaic cells or cell areas and an increase in the service life of shaded photovoltaic cells, with the disadvantages mentioned not occurring, and, in particular with at least partial shading of a photovoltaic cell, the photovoltaic element not being damaged. In particular, there should be as little active area loss as possible and there should be only a minimal influence on the performance.

In an embodiment, a photovoltaic element is provided, which comprises at least one photovoltaic cell, having a base electrode, a top electrode, and a layer system comprising at least one photoactive layer, wherein the layer system is arranged between the base electrode and the top electrode. The at least one photovoltaic cell is at least partly segmented into segments, wherein the segmentation is designed in such a way that at least the top electrode and the layer system of one segment are separated from the top electrode and the layer system of another segment, or the top electrode, the layer system and at least partly the base electrode of one segment are separated from the top electrode, the layer system and at least partly the base electrode of another segment in each case by at least one cavity so as to prevent contact between one another, wherein the at least one cavity is formed at least substantially vertical relative to the layer system of the at least one photovoltaic cell, and wherein the segments of the at least one photovoltaic cell are electrically conductively connected in parallel with one another such that a flow of electric current through the at least one photovoltaic cell is distributed over the individual segments.

In a preferred embodiment, the base electrode, the layer system and the top electrode are laser structured. In a preferred embodiment, the base electrode forms a cathode and the top electrode forms an anode.

In a preferred embodiment of the invention, the base electrode is arranged on a substrate, in particular a film.

A cavity is understood, in particular, as a space between at least two segments that separates the segments from one another at least in sections, such that there is at least no electrically conductive connection between the at least two segments via such a section and/or the segments do not contact one another in this section area. A cavity forms a specific distance between two segments one below the other horizontally to the layer system. The cavity is, in particular, an intermediate space.

In particular, an embodiment the invention discloses a technical solution for preventing damage to photovoltaic elements, in particular organic photovoltaic elements, by what are known as hot spots. The implementation of this solution allows a photovoltaic element composed of multiple photovoltaic cells to continue to function without impairment even if one or more photovoltaic cells are shaded.

Segmentation is understood to mean, in particular, at least partial separation of the top electrode and the layer system, or the top electrode, the layer system and at least partly the base electrode of the photovoltaic cell, such that, in the event of at least partial shading and/or a defect in the at least one photovoltaic cell, an electric current in each individual segment obtained is large enough not to damage the photovoltaic cell. Depending on the desired limitation of the current density in the respective segments, the segments can be segmented depending on a cross-sectional area of the segments, in particular a width and a length of the segments, with a current density in individual segments being lower compared to a photovoltaic cell without segmentation. In a preferred embodiment of the invention, the current flow decreases in the individual segments, in particular the current density is so low, in such a way that an at least partly shaded photovoltaic cell, in particular a fully shaded photovoltaic cell, remains able to conduct the flow of current of the non-shaded neighboring photovoltaic cells without damage.

Shading is understood to mean, in particular, an at least partial reduction in the incidence of light on a photovoltaic element, with, in particular, an at least essentially opaque object casting its shadow from the sun onto components of a photovoltaic element. In a shaded or at least partly shaded cell, an opposite voltage is present in comparison with a non-shaded cell when light is irradiated, since no or a lower flow of current is generated in the at least partly shaded cell itself. As a result, an at least partly shaded cell connected in series with other non-shaded cells can be damaged.

A defect is understood to mean, in particular, a fault in a layer system of a photovoltaic cell or in the electrically conductive connection of the layer system comprising at least one electrode.

A photovoltaic element is understood to mean, in particular, a solar cell, with the photovoltaic element having at least one photovoltaic cell. The photovoltaic cells can be arranged and/or connected in the photovoltaic element in different ways. The photovoltaic element is preferably constructed from a plurality of photovoltaic cells, which are connected in series.

A possible structure of the layer system of a photovoltaic cell is described in WO2004083958A2, WO2011013219A1, WO2011138021A2, WO2011161108A1. In the applications specified here, use is preferably made of layer systems in which the photoactive layers comprise absorbent materials which are evaporable and which are or have been applied by physical vapor deposition (PVD). To this end, use is made of materials belonging to the group of "small molecules", which are described, inter alia, in WO2006092134A1, WO2010133208A1, WO2014206860A1, WO2014128278A1, WO2017114937A1, and WO2017114938A1. The photoactive layers form acceptor/donor systems, and may be formed of a plurality of individual layers, or mixed layers, as a planar heterojunction and preferably as a bulk heterojunction. Layer systems that can be completely applied by way of physical vapor deposition are preferred.

The layer system can be in the form of a single cell, tandem cell or multicell, the designation being determined by the number of subcells, with each subcell containing at least one photoactive layer which are preferably separated by transport layers, and optional recombination layers, and which themselves may consist of a plurality of layers. The p-layer systems or n-layer systems, also referred to simply as p-layer or n-layer, may consist of a plurality of layers, with at least one of the layers of the p-layer system or n-layer system being p-doped or n-doped, preferably as a p-doped or n-doped wide gap layer. The i-layer system, also referred to as i-layer, is an undoped or less doped, that is to say has weaker doping, in relation to the p- and n-layers in the subcell, and is in the form of a photoactive layer. Each of these n-, p-, layers may consist of further layers, with the n- and p-layer consisting of at least one doped n- and p-layer, respectively, which as a result of its doping contributes to an increase in the charge carriers. This means that the layer stack of the photovoltaic cell consists of an expedient combination of p-, n-, and i-layer systems, that is to say each subcell comprises an i-layer system and at least one p- or n-layer system.

A horizontal extension of the layer system is understood to mean, in particular, a direction running essentially parallel to a substrate and/or to a layer of the layer system.

In a preferred embodiment, the photovoltaic element has a cell comprising at least one photoactive layer, in particular a CIS-, CIGS-, GaAs-, or Si-cell, a perovskite cell or an organic photovoltaic element (OPV), a so-called organic solar cell. An organic photovoltaic element is understood to mean in particular a photovoltaic element having at least one organic photoactive layer, in particular a polymer organic photovoltaic element or an organic photovoltaic element on the basis of small molecules. While polymers are distinguished by being not evaporable and therefore only being able to be applied from solutions, small molecules are usually evaporable and can either be applied like polymers as a solution, but also by means of vapor deposition technology, in particular by vapor deposition from a vacuum. The photovoltaic element is particularly preferably a flexible organic small-molecule-based photovoltaic element.

In a preferred embodiment of the invention, the photoactive layer of the layer system comprises small molecules which are evaporable in vacuo. In a preferred embodiment of the invention, at least the photoactive layer of the layer system is vapor deposited in vacuo.

Small molecules are understood to mean, in particular, non-polymeric organic molecules having monodisperse molar masses between 100 and 2000 g/mol that exist in the solid phase at standard pressure (air pressure of the ambient atmosphere) and at room temperature. In particular, the small molecules are photoactive, "photoactive" being understood to mean that the molecules undergo a change of charge state and/or of polarization state when light is supplied.

In a preferred embodiment of the invention, the top electrode comprises silver or a silver alloy, aluminum or an aluminum alloy, gold or a gold alloy, or a combination of these materials, preferably comprising as silver alloy Ag:Mg or Ag:Ca.

The photovoltaic element according to the invention has advantages over the prior art. Advantageously, protection of the photovoltaic element against hot spots is made possible; in particular, a current generated in non-shaded cells can be divided between the individual segments of an at least partly shaded cell, thereby preventing damage to the at least partly shaded cell. The photovoltaic element can thus continue to generate electricity using the other non-shaded cells. The at least one photovoltaic cell is advantageously not damaged in the event of at least partial shading and/or in the event of a defect in the photovoltaic cell. Advantageously, the efficiency is increased when individual photovoltaic cells of the photovoltaic element are shaded, and the service life of the photovoltaic element is increased. Advantageously, there is no or at least substantially no loss of area of the photovoltaic cell and/or there is no loss or at least substantially no loss in the performance of the photovoltaic cell. A flow of electric current from the preceding photovoltaic cell is advantageously distributed to the individual segments of the at least partly shaded photovoltaic cell. Advantageously, the segmentation can be integrated particularly easily into current production methods; in particular, only a small amount of effort is required for programming the laser structuring. Production can advantageously be integrated into a roll-to-roll process. The segmentation can be incorporated directly into the layer system during production without the use of additional external components, in particular diodes.

Advantageously, the segmentation of photovoltaic cells is more cost-effective compared to other solutions, especially compared to bypass diodes. Advantageously, the electric current flowing through the individual segments is lower.

According to an embodiment of the invention, provision is made for the photovoltaic element to comprise at least a first photovoltaic cell and a second photovoltaic cell, wherein the at least first photovoltaic cell and second photovoltaic cell are connected in series, and wherein the top electrode of the first photovoltaic cell is electrically conductively connected to the base electrode of the second photovoltaic cell, wherein the base electrodes of the photovoltaic cells are preferably separated from one another in the horizontal direction, relative to the layer system, and the top electrodes of the photovoltaic cells are separated from one another in the horizontal direction, relative to the layer system.

According to an embodiment of the invention, provision is made for a cross-sectional area of the segments of the at least one photovoltaic cell, based on the horizontal extent of the layer system, to be the same as one another, wherein preferably a size of the cross-sectional area of the segments is the same depending on a flow of current through the at least one photovoltaic cell. In the case of a lower flow of current through an individual segment, the current density becomes lower, wherein the current density becoming greater with a larger flow of current through an individual segment.

A cross-sectional area is understood to mean, in particular, an area of a segment in the horizontal extension of the layer system, in particular along a layer of the layer system.

According to an embodiment of the invention, provision is made for a width of a segment to be 1 cm to 2 m, preferably 5 cm to 1 m, and/or a distance between the individual segments with respect to each other horizontally to the layer system to be in a range from 10 nm to 200 nm, preferably from 40 nm to 80 nm. The distance between the individual segments is formed, in particular, by the at least one cavity.

According to an embodiment of the invention, provision is made for a length of the segments, in particular the length of the at least one photovoltaic cell, to be 1 mm to 1 m, preferably 5 mm to 5 cm, wherein the segments are preferably formed at least substantially parallel to one another.

According to an embodiment of the invention, provision is made for the individual segments to each be formed over an entire direction of the photovoltaic cell, wherein a shape of the segments is preferably of different design.

According to an embodiment of the invention, provision is made for the segments to be at least substantially parallel, preferably strip-shaped, wherein the segments of a subsequent photovoltaic cell are preferably offset parallel relative to each other compared to the preceding photovoltaic cell.

According to an embodiment of the invention, provision is made for the photovoltaic cells of the photovoltaic element to be electrically conductively connected by means of at least one busbar.

Photovoltaic cells are divided into single, tandem or multiple cells depending on the number of photoactive layer systems, transport and other layers in the layer structure between the two base and top contacts. Tandem and multiple cells consist of at least two sub-cells that are arranged one above the other between the electrodes, with each sub-cell comprising at least one photoactive layer system.

According to an embodiment of the invention, provision is made for the layer system to comprise at least two photoactive layers, wherein the photovoltaic cell is a tandem cell, to preferably comprise at least three photoactive layers, wherein the photovoltaic cell is a triple cell, and/or for the layer system to additionally comprise at least one charge carrier transport layer, wherein the at least one charge carrier transport layer is arranged between the base electrode or the top electrode and a photoactive layer, to preferably comprise at least a first charge carrier transport layer and a second charge carrier transport layer, wherein the first charge carrier transport layer is arranged between the base electrode and the at least one photoactive layer and wherein the second charge carrier transport layer is arranged between the at least one photoactive layer and the top electrode.

According to an embodiment of the invention, provision is made for the photovoltaic element to be an organic photovoltaic element, preferably a flexible organic photovoltaic element, with at least one photoactive layer of the organic photovoltaic element preferably having small molecules as an absorber material.

In particular, a flexible photovoltaic is understood to mean a photovoltaic element which is bendable and/or stretchable in a certain region.

According to an embodiment of the invention, provision is made for the photovoltaic element not to have a bypass diode.

Advantageous of the present invention are also achieved by providing a photovoltaic system, comprising at least two photovoltaic elements, especially according to one of the exemplary embodiments described above. For the photovoltaic system, this results, in particular, in the advantages that have already been described in connection with the photovoltaic element comprising at least one photovoltaic cell. The at least two photovoltaic elements are connected in series in this case. The photovoltaic elements preferably consist of photovoltaic cells connected in series with one another. The photovoltaic cells are preferably connected in series by electrically conductively connecting the top electrode of one photovoltaic cell to the base electrode of the following photovoltaic cell.

Advantages of the present invention are also achieved by providing a method for producing a photovoltaic element, in particular a flexible photovoltaic element, comprising at least two photovoltaic cells, each having a base electrode, a top electrode, and a layer system arranged between the base electrode and the top electrode, wherein the layer system has at least one photoactive layer, in particular according to one of the exemplary embodiments described above. For the method, this results, in particular, in the advantages that have already been described in connection with the photovoltaic element comprising at least one photovoltaic cell and in connection with the photovoltaic system. The method comprises the following steps:
  a) providing a substrate with a base electrode layer,
  b) laser structuring of the base electrode layer so that the base electrode layer is divided into individual base electrodes,
  c) applying a layer system having at least one photoactive layer to the structured base electrodes, and forming at least one opening in the layer system associated with each individual base electrode by means of laser ablation, wherein the base electrodes are at least partly exposed at the at least one opening,
  d) applying a top electrode layer into the at least one opening and/or onto the layer system with the at least one opening, wherein the at least one opening is filled,
  e) laser structuring of the top electrode layer and the layer system so that individual top electrodes and individual layer systems are formed, wherein the top electrode of a first photovoltaic cell is electrically conductively connected to the base electrode of a second photovoltaic cell, and
  f) segmenting at least the top electrode and the layer system, or the top electrode, the layer system and at least partly the base electrode of the at least one photovoltaic cell by means of laser ablation, wherein segments of the at least one photovoltaic cell are formed.

In a preferred embodiment of the invention, step e) and step f) are carried out simultaneously.

In a preferred embodiment of the invention, in order to form the opening by means of laser ablation in step c), laser structuring in step b) and step e), and/or for segmentation in step f) parameters of the at least one laser beam, preferably an energy density, a pulse duration, a pulse shape, a pulse frequency and/or a wavelength, are adjusted depending on the material and the layer thickness of the base electrode, the layer system and/or the top electrode.

In a preferred embodiment of the invention, the base contact and the layer system, the individual layers of the layer system, and/or the layer system and the top electrode are electrically conductively connected by suitable structuring, in particular laser structuring.

In a preferred embodiment of the invention, the layers are applied by means of a printing method, preferably an inkjet method, a screen-printing method, and/or a flexographic method, and/or by means of vapor deposition of the materials to be applied.

In a preferred embodiment of the invention, the wavelength range of the laser in the laser ablation in step c), the laser structuring in step b) and in step e) and/or in the segmentation in step f) is 300 nm to 1200 nm, preferably 400 nm to 1000 nm, or preferably 450 nm to 800 nm.

In a preferred embodiment of the invention, an energy density of the at least one laser beam in the laser ablation in step c) and/or the segmentation in step f) is adjusted during the ablation as a function of a removal depth of the layer system.

In a preferred embodiment of the invention, the layer system is electrically conductively connected to the base electrode and/or the top electrode by means of laser structuring.

According to an embodiment of the invention, provision is made for the top electrode layer to be divided in the horizontal direction in relation to the layer system of the at least one photovoltaic cell so that top electrodes are obtained, and the base electrode layer is divided in the horizontal direction based on the layer system of the at least one photovoltaic cell so that base electrodes are obtained.

According to an embodiment of the invention, provision is made for the method to be used in a roll-to-roll process.

In a preferred embodiment of the invention, the structuring takes place during the application of individual layers of the layer system. In an alternatively preferred embodiment of the invention, the structuring takes place after the application of individual layers of the layer system.

The invention is elucidated in more detail hereinbelow with reference to the drawings. The figures show:

FIG. 1 shows a schematic representation of a structure of a layer system 5 comprising electrodes 3, 4 of a photovoltaic cell 2.

Photovoltaic elements 1, in particular organic photovoltaic elements 1, consist of a sequence of thin layers, the layer system 5, with at least one photoactive layer 6, which is preferably vapor deposited in vacuo or processed from a solution. The electrical link can be implemented by metal layers, transparent conductive oxides and/or transparent conductive polymers. The vacuum vapor deposition of the organic layers is advantageous, in particular, when producing multi-layer solar cells, in particular tandem cells or triple cells. A layer system 5 of such a photovoltaic cell 2 is depicted in one exemplary embodiment in FIG. 1.

In this exemplary embodiment, the photovoltaic cell 2 has glass as the substrate 13, comprising a transparent base electrode 3 made of ITO (M) 14, a layer system 5 consisting of a layer of fullerene C60 15, a photoactive layer 16 comprising at least one absorber material and fullerene C60, and a p-doped hole transport layer 17 made of Di-NPB and NDP9, and a top electrode 4 made of gold 18.

Figure 2:
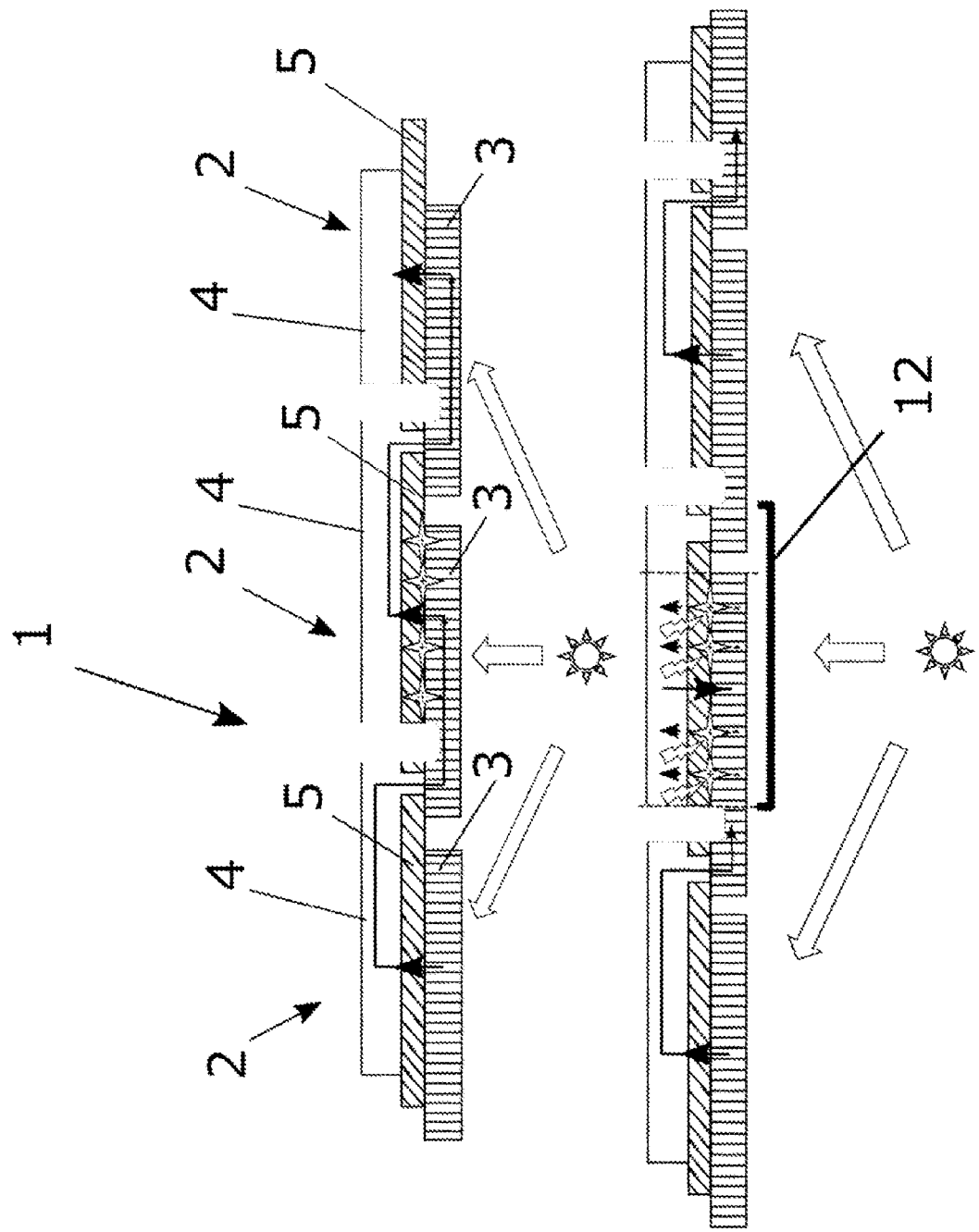
FIG. 2 shows a schematic representation of a photovoltaic element to clarify the problem with at least partly shaded photovoltaic cells in a side view.

FIG. 2 shows a schematic representation of a photovoltaic element 1 to clarify the problem with at least partly shaded photovoltaic cells 2 in a side view. Identical and functionally equivalent elements have been provided with the same reference signs, and so reference is made to the description above in this respect.

A problem in series-connected photovoltaic cells 2 with at least partial shading 12 of the photovoltaic cells 2 is that the shaded photovoltaic cells 2 are reverse-biased diodes with respect to the series-connected, unshaded or less shaded photovoltaic cells 2. They thus impede the outflow of the photogenerated current, which has a negative effect on efficiency. There is also the risk that a concentrated flow of current can occur in the shaded photovoltaic cells 2 due to defect points, which can lead to local overheating and finally to irreversible degradation of the photovoltaic cell 2 and thus to a loss of efficiency of the photovoltaic element 1.

An example of degradation of a photovoltaic cell 2 caused by at least partial shading 12 is shown in FIG. 2. The at least partial shading 12 in this case leads to undesired localized damage to the photovoltaic cell 2.

Figure 3:
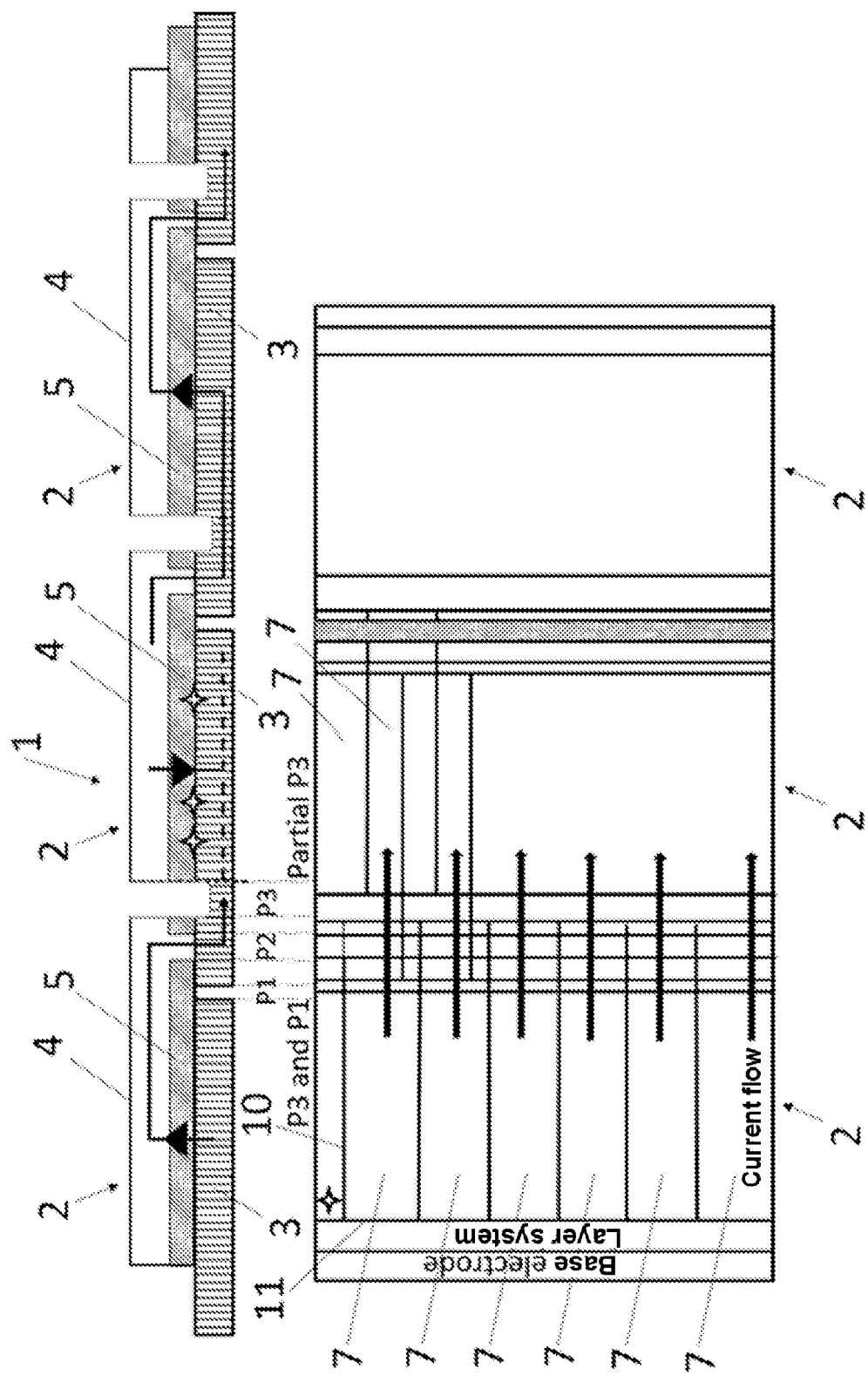
FIG. 3 shows a schematic representation of an exemplary embodiment of a photovoltaic element with segmentation in a side view and a plan view.

FIG. 3 shows a schematic representation of an exemplary embodiment of a photovoltaic element 1 with segmentation in a side view and a plan view. Identical and functionally equivalent elements have been provided with the same reference signs, and so reference is made to the description above in this respect.

The photovoltaic element 1 has at least one photovoltaic cell 2, having a base electrode 3, a top electrode 4, and a layer system 5 comprising at least one photoactive layer 6, wherein the layer system 5 is arranged between the base electrode 3 and the top electrode 4. The at least one photovoltaic cell 2 is at least partly segmented into segments 7, wherein the segmentation is designed in such a way that at least the top electrode 4 and the layer system 5 of one segment 7 are separated from the top electrode 4 and the layer system 5 of another segment 7, or the top electrode 4, the layer system 5 and at least partly the base electrode 3 of one segment 7 are separated from the top electrode 4, the layer system 5 and at least partly the base electrode 3 of another segment 7 in each case by at least one cavity 8 so as to prevent contact between one another, wherein the at least one cavity 8 is formed at least substantially vertical relative to the layer system 5 of the at least one photovoltaic cell 2, and wherein the segments 7 of the at least one photovoltaic cell 2 are electrically conductively connected in parallel with one another such that a flow of electric current through the at least one photovoltaic cell 2 is distributed over the individual segments 7.

As a result, the at least one photovoltaic cell 2 is not damaged in the event of at least partial shading 12 and/or in the event of a defect in the photovoltaic cell 2, in particular is not damaged by a hot spot. Furthermore, the efficiency is increased when individual photovoltaic cells 2 of the photovoltaic element 1 are shaded 12, and the service life of the photovoltaic element is increased in a manner associated therewith. Advantageously, there is no or at least substantially no loss of area of the photovoltaic cell 2 and/or there is at least substantially no loss in the performance of the photovoltaic cell 2. The segmentation can be integrated particularly easily into present production methods; in particular, only a small amount of effort is required for programming the laser structuring.

In one configuration of the invention, the photovoltaic element 1 comprises at least a first photovoltaic cell 2 and a second photovoltaic cell 2, wherein the at least first photovoltaic cell 2 and second photovoltaic cell 2 are connected in series, and wherein the top electrode 4 of the first photovoltaic cell 2 is electrically conductively connected to the base electrode 3 of the second photovoltaic cell 2, wherein the base electrodes 3 of the photovoltaic cells 2 are preferably separated from one another in the horizontal direction, relative to the layer system 5, and the top electrodes 4 of the photovoltaic cells 2 are separated from one another in the horizontal direction, relative to the layer system 5. The top electrode 4 of a preceding photovoltaic cell 2 is preferably electrically conductively connected in each case to the base electrode 3 of a following photovoltaic cell 2.

In a further configuration of the invention, a cross-sectional area 9 of the segments 7 of the at least one photovoltaic cell 2, based on the horizontal extent of the layer system 5, is the same as one another, wherein preferably a size of the cross-sectional area 9 of the segments 7 is designed depending on a flow of current through the at least one photovoltaic cell 2.

In a further configuration of the invention, a width 10 of a segment 7 is 1 cm to 2 m, preferably 5 cm to 1 m, and/or a distance between the individual segments 7 with respect to each other horizontally to the layer system 5 is in a range from 10 nm to 200 nm, preferably from 40 nm to 80 nm.

In a further configuration of the invention, a length 11 of the segments 7, in particular the length 11 of the at least one photovoltaic cell 2, is 1 mm to 1 m, preferably 5 mm to 5 cm, wherein the segments 7 are preferably formed at least substantially parallel to one another.

In a further configuration of the invention, the individual segments 7 are each formed over an entire direction of the photovoltaic cell 2, wherein a shape of the segments 7 is preferably of different design.

In a further configuration of the invention, the segments 7 are at least substantially parallel, preferably strip-shaped, wherein the segments 7 of a subsequent photovoltaic cell 2 are preferably offset parallel relative to each other compared to the preceding photovoltaic cell 2.

In a further configuration of the invention, the photovoltaic cells 2 of the photovoltaic element 1 are electrically conductively connected by means of at least one busbar.

In a further embodiment of the invention, the layer system 5 comprises at least two photoactive layers 6, the photovoltaic cell 2 being a tandem cell, preferably at least three photoactive layers 6, the photovoltaic cell 2 preferably being a triple cell, and/or the layer system 5 additionally comprises at least one charge carrier transport layer, the at least one charge carrier transport layer being disposed between the base electrode 3 or the top electrode 4 and a photoactive layer 6, preferably comprises at least a first charge carrier transport layer and a second charge carrier transport layer, the first charge carrier transport layer being disposed between the base electrode 3 and the at least one photoactive layer 6 and the second charge carrier transport layer being disposed between the at least one photoactive layer 6 and the top electrode 4.

In a further configuration of the invention, the photovoltaic element 1 is an organic photovoltaic element 1, preferably a flexible organic photovoltaic element 1, with at least one photoactive layer 6 of the organic photovoltaic element 1 preferably having small molecules as an absorber material.

In a further configuration of the invention, the photovoltaic element 1 has no bypass diode.

A photovoltaic system is formed by connecting at least two photovoltaic elements 1 in series with one another.

The method for producing a photovoltaic element 1, in particular a flexible photovoltaic element 1, comprising at least two photovoltaic cells 2, each having a base electrode 3, a top electrode 4, and a layer system 5 arranged between the base electrode 3 and the top electrode 4, wherein the layer system 5 has at least one photoactive layer 6, comprises the following steps:

a) providing a substrate 13 with a base electrode layer,
b) laser structuring of the base electrode layer so that the base electrode layer is divided into individual base electrodes 3,
c) applying a layer system 5 having at least one photoactive layer 6 to the structured base electrodes 3, and forming at least one opening in the layer system 5 associated with each individual base electrode 3 by means of laser ablation, wherein the base electrodes 3 are at least partly exposed at the at least one opening,
d) applying a top electrode layer into the at least one opening and/or onto the layer system 5 with the at least one opening, wherein the at least one opening is filled,
e) laser structuring of the top electrode layer and the layer system 5 so that individual top electrodes 4 and individual layer systems 5 are formed, wherein the top electrode 4 of a first photovoltaic cell 2 is electrically conductively connected to the base electrode 3 of a second photovoltaic cell 2, and
f) segmenting at least the top electrode 4 and the layer system 5, or the top electrode 4, the layer system 5 and at least partly the base electrode 3 of the at least one photovoltaic cell 2 by means of laser ablation, wherein segments 7 of the at least one photovoltaic cell 2 are formed. The layer system is preferably electrically conductively connected to the base electrode 3 and/or the top electrode 4 by means of laser structuring.

The laser structuring of the top electrode layer and the layer system 5 in step e) and the segmentation in step f) can be carried out simultaneously.

In a configuration of the invention, the top electrode layer is divided in the horizontal direction in relation to the layer system 5 of the at least one photovoltaic cell 2 so that top electrodes 4 are obtained, and the base electrode layer is divided in the horizontal direction based on the layer system 5 of the at least one photovoltaic cell 2 so that base electrodes 3 are obtained.

In a further configuration of the invention, the layer system 5 is applied at least partially by evaporation in vacuo.

In a further configuration of the invention, the method is used in a roll-to-roll process.

In one exemplary embodiment, the following parameters are used in the laser ablation in step b): a laser speed of 4 μJ-385 mm/s, and an energy of each laser pulse of 25 kHz (25 pulses per second).

In one embodiment (FIG. 3), the substrate 13 provided is coated and structured (P1) with a base electrode layer of the photovoltaic cell 2 after it has been provided, the base electrode layer being separated into base electrodes 3 of the individual segments 7. The layer system 5 is subsequently applied to the base electrodes 3. The layer system 5 can be applied as a single cell, tandem cell or multi-cell, preferably by evaporating of small molecules. The application of individual layers to a region of the base electrode 3 for the purposes of forming the layer system 5 can be implemented at least in part by way of a printing process, preferably by an inkjet, screen printing, gravure printing or flexographic process, or by the vapor deposition of the materials to be applied. The layer system 5, in particular individual layers of the layer system 5, is preferably applied by means of physical vapor deposition in vacuo. The layer system 5 of the photovoltaic cells 2 (P2) is then structured. The top electrode layer is applied to the layer system 5, and the final structuring (P3) separates the top electrode layer into individual top electrodes 4. By way of example, the individual layers of the photovoltaic cell 2 can be structured by means of laser ablation, electron or ion beam ablation, or shadow masks.

In one exemplary embodiment, the following parameters are used for structures P1/P2/P3 using a laser:

P1: 1030 nm wavelength and 50 μm line width; P2: 515 nm wavelength and 50 μm line width; and P3: 1030 nm wavelength and 100 μm line width. P1/P2/P3 are connected in series here, whereas the individual segments are connected in parallel.

An exemplary embodiment of laser structuring of the photovoltaic cells 2 is shown in FIG. 3. Structures P1/P2/P3 are shown. The flow of current is marked by arrows. In this exemplary embodiment, the photogenerated current flows, in particular, via the top electrode 4 of the shaded photovoltaic cell 2 divided into the individual segments 7 of the photovoltaic cell 2 and can flow into the base electrode 3 there to an improved extent via the additional P2 structuring.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A photovoltaic element comprising:
at least one photovoltaic cell, each photovoltaic cell being at least partially segmented into segments and having a base electrode, a top electrode, and a layer system comprising at least one photoactive layer, wherein:
the layer system is arranged between the base electrode and the top electrode,
the segments of a respective photovoltaic cell of the at least one photovoltaic cells are configured such that the top electrode and the layer system of one of the segments of the respective photovoltaic cell are separated from the top electrode and the layer system of another segment of the respective photovoltaic cell by at least one cavity so as to prevent contact between one another without the at least one cavity separating the base electrodes of the segments from one another, or wherein the segments of the respective photovoltaic cell are configured such that the top electrode, the layer system, and only part of the base electrode of one of the segments of the respective photovoltaic cell are separated from the top electrode, the layer system, and only part of the base electrode of another segment of the respective photovoltaic cell by the at least one cavity, the at least one cavity is formed at least substantially vertically relative to the layer system of the at least one photovoltaic cell, and the segments of the respective photovoltaic cell are electrically conductively connected in parallel with one another such that a flow of electric current through the respective photovoltaic cell is distributed over each of the segments of the respective photovoltaic cell.

2. The photovoltaic element as claimed in claim 1, comprising a first photovoltaic cell and a second photovoltaic cell, wherein:

the first photovoltaic cell and second photovoltaic cell are connected in series, the top electrode of the first photovoltaic cell is electrically conductively connected to the base electrode of the second photovoltaic cell, the base electrode of each of the first and second photovoltaic cells are separated from one another in a horizontal direction, relative to the layer system, and the top electrode of each of the first and second photovoltaic cells are separated from one another in the horizontal direction, relative to the layer system.

3. The photovoltaic element as claimed in claim 1, wherein a cross-sectional area of the segments of the respective photovoltaic cell, based on a horizontal extent of the layer system, is the same as one another, and wherein a size of the cross-sectional area of the segments is the same depending on a flow of current through the respective photovoltaic cell.

4. The photovoltaic element as claimed in claim 1, wherein a width of each segment is 1 cm to 2 m, or a distance between individual segments with respect to each other horizontally to the layer system is in a range from 10 nm to 200 nm.

5. The photovoltaic element as claimed in claim 1, wherein a length of each of the at least one photovoltaic cells, is 1 mm to 1 m, and wherein the segments are formed at least substantially parallel to one another.

6. The photovoltaic element as claimed in claim 1, wherein each of the segments are formed over an entire direction of the respective photovoltaic cell, and wherein a shape of the segments is of different design.

7. The photovoltaic element as claimed in claim 1, wherein the segments are at least substantially parallel and strip-shaped, and wherein segments of a subsequent photovoltaic cell are offset and parallel relative to the segments of the respective photovoltaic cell.

8. The photovoltaic element as claimed in claim 1, comprising two or more photovoltaic cells, and wherein the at least two photovoltaic cells are electrically conductively connected by at least one busbar.

9. The photovoltaic element as claimed in claim 1, wherein:

the layer system comprises at least two photoactive layers, the photovoltaic cell is a tandem cell having two photoactive layers or the photovoltaic cell is a triple cell having three photoactive layers, and the layer system additionally comprises at least one charge carrier transport layer, the at least one charge carrier transport layer being arranged between the base electrode or the top electrode and a photoactive layer.

10. The photovoltaic element as claimed in claim 9, wherein the layer system comprises at least a first charge carrier transport layer and a second charge carrier transport layer, wherein the first charge carrier transport layer is arranged between the base electrode and the at least one photoactive layer and wherein the second charge carrier transport layer is arranged between the at least one photoactive layer and the top electrode.

11. The photovoltaic element as claimed in claim 1, wherein the photovoltaic element is a flexible organic photovoltaic element, and wherein at least one photoactive layer of the flexible organic photovoltaic element comprises small molecules as an absorber material.

12. The photovoltaic element as claimed in claim 1, wherein the photovoltaic element has no bypass diode.

13. A photovoltaic system, comprising at least two photovoltaic elements as claimed in claim 1, wherein the at least two photovoltaic elements are connected in series.

14. The photovoltaic element as claimed in claim 1, wherein a width of a segment is 5 cm to 1 m and a distance between individual segments with respect to one another horizontally to the layer system is in a range from 40 nm to 80 nm.

15. The photovoltaic element as claimed in claim 1, wherein a length of the at least one photovoltaic cell is 5 mm to 5 cm, and wherein the segments are formed at least substantially parallel to one another.

16. The photovoltaic element as claimed in claim 1, wherein the base electrode of segments of the respective photovoltaic cell are not fully separated from one another by the at least one cavity, and wherein the base electrodes of separate photovoltaic cells of the at least one photovoltaic cell are separated from one another.

17. A method for producing a photovoltaic element as claimed in claim 1 comprising at least two photovoltaic cells, each having a base electrode, a top electrode, and a layer system arranged between the base electrode and the top electrode, wherein the layer system has at least one photoactive layer, comprising the following steps:

providing a substrate with a base electrode layer, laser structuring the base electrode layer so that the base electrode layer is divided into individual base electrodes, applying a layer system having at least one photoactive layer to the structured base electrodes, and forming at least one opening in the layer system associated with each individual base electrode by laser ablation, wherein the base electrodes are at least partly exposed at the at least one opening, applying a top electrode layer into the at least one opening or onto the layer system with the at least one opening, wherein the at least one opening is filled, laser structuring the top electrode layer and the layer system so that individual top electrodes and individual layer systems are formed, wherein the top electrode of a first of the at least two photovoltaic cells is electrically conductively connected to the base electrode of a second of the at least two photovoltaic cells, and segmenting at least the top electrode and the layer system, or the top electrode, the layer system and partly the base electrode of each photovoltaic cell by laser ablation, such that segments of each of the at least two photovoltaic cells are formed.

18. The method for producing a photovoltaic element as claimed in claim 17, comprising:

dividing the top electrode layer in a horizontal direction in relation to the layer system of the at least two photovoltaic cells so that top electrodes are obtained, and
dividing the base electrode layer in the horizontal direction based on the layer system of the at least two photovoltaic cells so that base electrodes are obtained.

19. The method for producing a photovoltaic element as claimed in claim 17, wherein the method is used in a roll-to-roll process.

* * * * *